US008749430B2

(12) United States Patent
Shinonaga et al.

(10) Patent No.: US 8,749,430 B2

(45) Date of Patent: Jun. 10, 2014

(54) ACTIVE ARRAY ANTENNA DEVICE

(75) Inventors: Mitsuyoshi Shinonaga, Kawasaki (JP); Hiroyuki Kayano, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 13/307,335

(22) Filed: Nov. 30, 2011

(65) Prior Publication Data

US 2012/0262328 A1 Oct. 18, 2012

(30) Foreign Application Priority Data

Apr. 13, 2011 (JP) ................................ 2011-089001

(51) Int. Cl.

| | |
|---|---|
| ***G01S 13/00*** | (2006.01) |
| ***H01Q 3/00*** | (2006.01) |
| ***H01Q 21/08*** | (2006.01) |
| ***H03K 17/92*** | (2006.01) |

(52) U.S. Cl.

USPC ............. 342/27; 342/157; 342/175; 342/368; 342/371; 343/824; 505/201; 505/855

(58) Field of Classification Search

USPC ........... 342/27, 104, 107, 113, 118, 127, 133, 342/139, 146–158, 175, 368, 371; 343/824; 505/201, 855

See application file for complete search history.

(56) References Cited

U.S. PATENT DOCUMENTS

| | | | | | |
|---|---|---|---|---|---|
| 3,993,999 | A | * | 11/1976 | Hemmi et al. | 342/372 |
| 4,456,912 | A | * | 6/1984 | Ensley | 342/13 |
| 4,965,588 | A | * | 10/1990 | Lenormand et al. | 342/372 |
| 5,027,125 | A | * | 6/1991 | Tang | 342/368 |
| 5,038,147 | A | * | 8/1991 | Cerro et al. | 342/368 |
| 5,093,668 | A | * | 3/1992 | Sreenivas | 342/374 |
| 5,105,200 | A | * | 4/1992 | Koepf | 343/700 MS |
| H1079 | H | * | 7/1992 | White et al. | 342/361 |
| 5,132,694 | A | * | 7/1992 | Sreenivas | 342/373 |

(Continued)

FOREIGN PATENT DOCUMENTS

| | | |
|---|---|---|
| EP | 1 696 509 A | 8/2006 |
| EP | 2 073 310 A1 | 6/2009 |

(Continued)

OTHER PUBLICATIONS

The Extended European Search Report issued Aug. 2, 2012, in Application No. / Patent No. 11191410.7-2220.

(Continued)

*Primary Examiner* — Peter Bythrow

(74) *Attorney, Agent, or Firm* — Oblon, Spivak, McClelland, Maier & Neustadt, L.L.P.

(57) ABSTRACT

In one embodiment, an active array antenna device includes: M (M≥2) bandpass filters to filter signals received by M antenna elements; M low noise amplifiers to amplify the filtered received signals; M distributors to distribute respective of the M amplified signals into N (N≥2) distributed signals; M sets of N phase shifters provided for respective of the M distributors to shift phases of the N distributed signals; M sets of N attenuators to attenuate N phase-shift signals; N beam synthesis circuits provided for N sets of the M attenuators to synthesize a beam by summing attenuator outputs from the M attenuators corresponding to the M distributors; a heat insulating container accommodating the low noise amplifiers and the receiving filters and formed of a superconductor material; and a cooler to cool the receiving filters and the low noise amplifiers to make the receiving filters in a superconducting state.

13 Claims, 8 Drawing Sheets

(56) References Cited

U.S. PATENT DOCUMENTS

| | | | | | |
|---|---|---|---|---|---|
| 5,283,587 | A * | 2/1994 | Hirshfield et al. | 342/372 |
| 5,339,084 | A * | 8/1994 | Watanabe et al. | 342/160 |
| 5,339,086 | A * | 8/1994 | DeLuca et al. | 342/371 |
| 5,532,706 | A * | 7/1996 | Reinhardt et al. | 343/778 |
| 5,619,210 | A * | 4/1997 | Dent | 342/352 |
| 5,652,750 | A * | 7/1997 | Dent et al. | 370/326 |
| 5,745,077 | A * | 4/1998 | Das | 342/374 |
| 5,771,014 | A * | 6/1998 | Shinonaga | 342/140 |
| 5,859,610 | A * | 1/1999 | Lenormand et al. | 342/354 |
| 6,094,588 | A * | 7/2000 | Adam | 505/210 |
| 6,104,343 | A * | 8/2000 | Brookner et al. | 342/372 |
| 6,104,934 | A * | 8/2000 | Patton et al. | 455/561 |
| 6,169,513 | B1 * | 1/2001 | Cohen | 342/354 |
| 6,205,340 | B1 * | 3/2001 | Yandrofski et al. | 455/561 |
| 6,222,503 | B1 * | 4/2001 | Gietema et al. | 343/890 |
| 6,246,364 | B1 * | 6/2001 | Rao et al. | 342/368 |
| 6,263,215 | B1 * | 7/2001 | Patton et al. | 455/561 |
| 6,340,948 | B1 * | 1/2002 | Munoz-Garcia et al. | 342/373 |
| 6,363,268 | B1 * | 3/2002 | Schuchardt et al. | 505/201 |
| 6,411,256 | B1 * | 6/2002 | Lier et al. | 342/375 |
| 6,625,427 | B1 * | 9/2003 | Kayano et al. | 455/115.1 |
| 6,703,970 | B2 * | 3/2004 | Gayrard et al. | 342/354 |
| 6,768,456 | B1 * | 7/2004 | Lalezari et al. | 342/373 |
| 6,816,712 | B2 * | 11/2004 | Otaka et al. | 455/83 |
| 6,847,275 | B2 * | 1/2005 | Sayanagi et al. | 333/247 |
| 6,911,938 | B1 * | 6/2005 | Das | 342/354 |
| 6,934,519 | B2 * | 8/2005 | Kayano et al. | 455/115.1 |
| 6,937,117 | B2 * | 8/2005 | Terashima et al. | 333/205 |
| 6,954,173 | B2 * | 10/2005 | Mrstik | 342/173 |
| 6,972,716 | B2 * | 12/2005 | Davis et al. | 342/368 |
| 7,184,738 | B2 * | 2/2007 | Otaka et al. | 455/312 |
| 7,260,370 | B2 * | 8/2007 | Wang et al. | 455/135 |
| 7,373,126 | B2 * | 5/2008 | Narita | 455/234.1 |
| 7,394,424 | B1 * | 7/2008 | Jelinek et al. | 342/375 |
| 7,755,538 | B2 * | 7/2010 | Shinonaga | 342/160 |
| 7,916,083 | B2 * | 3/2011 | Thiesen et al. | 342/372 |
| 7,983,637 | B2 * | 7/2011 | Kayano | 455/127.2 |
| 8,005,451 | B2 * | 8/2011 | Kayano et al. | 455/286 |
| 8,203,483 | B2 * | 6/2012 | Richards | 342/368 |
| 8,259,686 | B2 * | 9/2012 | Kanto et al. | 370/334 |
| 8,502,735 | B1 * | 8/2013 | Moosbrugger et al. | 343/700 |
| 2002/0005800 | A1 * | 1/2002 | Caille et al. | 342/354 |
| 2002/0057219 | A1 * | 5/2002 | Obayashi | 342/372 |
| 2002/0089449 | A1 * | 7/2002 | Fox | 342/417 |
| 2002/0128045 | A1 * | 9/2002 | Chang et al. | 455/562 |
| 2003/0030594 | A1 * | 2/2003 | Larry | 343/895 |
| 2003/0146880 | A1 * | 8/2003 | Chiang et al. | 343/853 |
| 2003/0156060 | A1 * | 8/2003 | Revankar et al. | 342/372 |
| 2003/0189515 | A1 * | 10/2003 | Jacomb-Hood et al. | 342/373 |
| 2005/0093744 | A1 * | 5/2005 | Davis et al. | 342/368 |
| 2007/0096982 | A1 * | 5/2007 | Kalian et al. | 342/377 |
| 2007/0126630 | A1 * | 6/2007 | Coppi et al. | 342/377 |
| 2008/0278394 | A1 * | 11/2008 | Koh et al. | 343/754 |
| 2009/0011789 | A1 * | 1/2009 | Chang et al. | 455/524 |
| 2009/0156138 | A1 * | 6/2009 | Kanto et al. | 455/84 |
| 2009/0231197 | A1 * | 9/2009 | Richards | 342/377 |
| 2009/0273517 | A1 * | 11/2009 | Thiesen et al. | 342/372 |
| 2011/0148707 | A1 * | 6/2011 | Thiesen et al. | 342/372 |
| 2012/0127034 | A1 * | 5/2012 | DiFonzo | 342/375 |
| 2012/0299765 | A1 * | 11/2012 | Huang et al. | 342/81 |

FOREIGN PATENT DOCUMENTS

| | | |
|---|---|---|
| JP | 2000-201009 A | 7/2000 |
| JP | 2000-236206 | 8/2000 |
| JP | 2005-123761 A | 5/2005 |
| JP | 2008-113450 A | 5/2008 |
| JP | 2009-38567 A | 2/2009 |

OTHER PUBLICATIONS

Office Action issued May 21, 2013 in Japanese Patent Application No. 2011-089001 with English language translation.

* cited by examiner

ACTIVE ARRAY ANTENNA DEVICE

This application is based upon and claims the benefit of priority from Japanese Patent Application No. 2011-89001, filed Apr. 13, 2011; the entire contents of which are incorporated herein by reference.

FIELD

Embodiments described herein relate generally to an active array antenna device used as a reception antenna of a radar, a communication system, a microwave radiometer, a radio wave reception system, or the like.

BACKGROUND

The radar performance is expressed by a radar equation. To improve the radar performance, the following actions are generally taken in terms of parameters expressed in the radar equation: (a) increase of a transmission peak power and a pulse width; (b) increase of an antenna gain; (c) utilization of a long wavelength; (d) lowering of a system noise temperature; (e) reduction of a system loss; and the like.

The increase of a transmission peak power, the increase of the antenna size, and the like have a lot of restrictions and lead to an increase of the system size, and thus are under certain limitations in implementing these. The utilization of a long wavelength is difficult due to recent radio wave resource shortage.

Additionally there is an extremely strong demand for improving the radar performance, because of the advent of a so-called stealth, i.e., an object whose radio wave reflection is intentionally reduced. To meet the demand, highly sensitive reception performance is also needed, and thus the reduction of a system loss and the lowering of a system noise temperature are required.

Although the system loss includes various types of losses, a representative loss is a transmission feed loss occurring between a transmitter and an antenna. To reduce the transmission feed loss, used is an active array antenna using a number of modules called T/R modules (i.e. transceiver modules) each, as a single unit, having functions of transmission amplification, transmission-reception switching, and reception. In particular, the mainstream system is an active phased array system.

The active phased array system is an antenna system in which modules called the T/R modules (transceiver modules) are arranged. Between an antenna element and a phase shifter, each transceiver module incorporates: a transmission-reception switching function; and both (or either) of a transmission amplifier in a transmission system and a low noise amplifier (LNA) for reception in a reception system.

When the transmission amplifier is incorporated into the transceiver module, the module is arranged close to the antenna element. Thus, a feed loss due to a waveguide or the like does not occur, and the transmission feed loss can be limited to a loss from only essential components (such as a circulator).

When the reception LNA is incorporated into the transceiver module, a loss in reception can be reduced while multi-beams can be formed. That is, a received signal amplified by the LNA can be distributed into multiple signals without deteriorating S/N ratios, and thus multiple independent received beams can be formed from the distributed received signals.

The active phased array antenna which has the multiple received beams can detect different targets simultaneously and implement multiple functions simultaneously and independently. Thus, the active array antenna including at least the reception LNA provided for each antenna element is suitable to multi-functionalization requiring multi-beams.

Formation of the multiple received beams (received multi-beams) requires as many beam synthesis circuits as the received beams. Specifically, a signal received by each antenna element is amplified by the LNA and then is distributed into as many signals as necessary received beams, and the signals pass through attenuators, phase shifters, and the like which perform amplitude weighting for suppressing a side lobe and phase weighting for controlling the beam directivity. Thereafter, the beam synthesis circuits synthesize the received beams from the signals. The need for the multiple beam synthesis circuits causes a problem of increasing the system size.

Even the active phased array antenna cannot make the reception system highly sensitive by making the feed loss occurring between the antenna and the LNA close to zero and by reducing an internal noise of the LNA.

DETAILED DESCRIPTION

Figure 1:
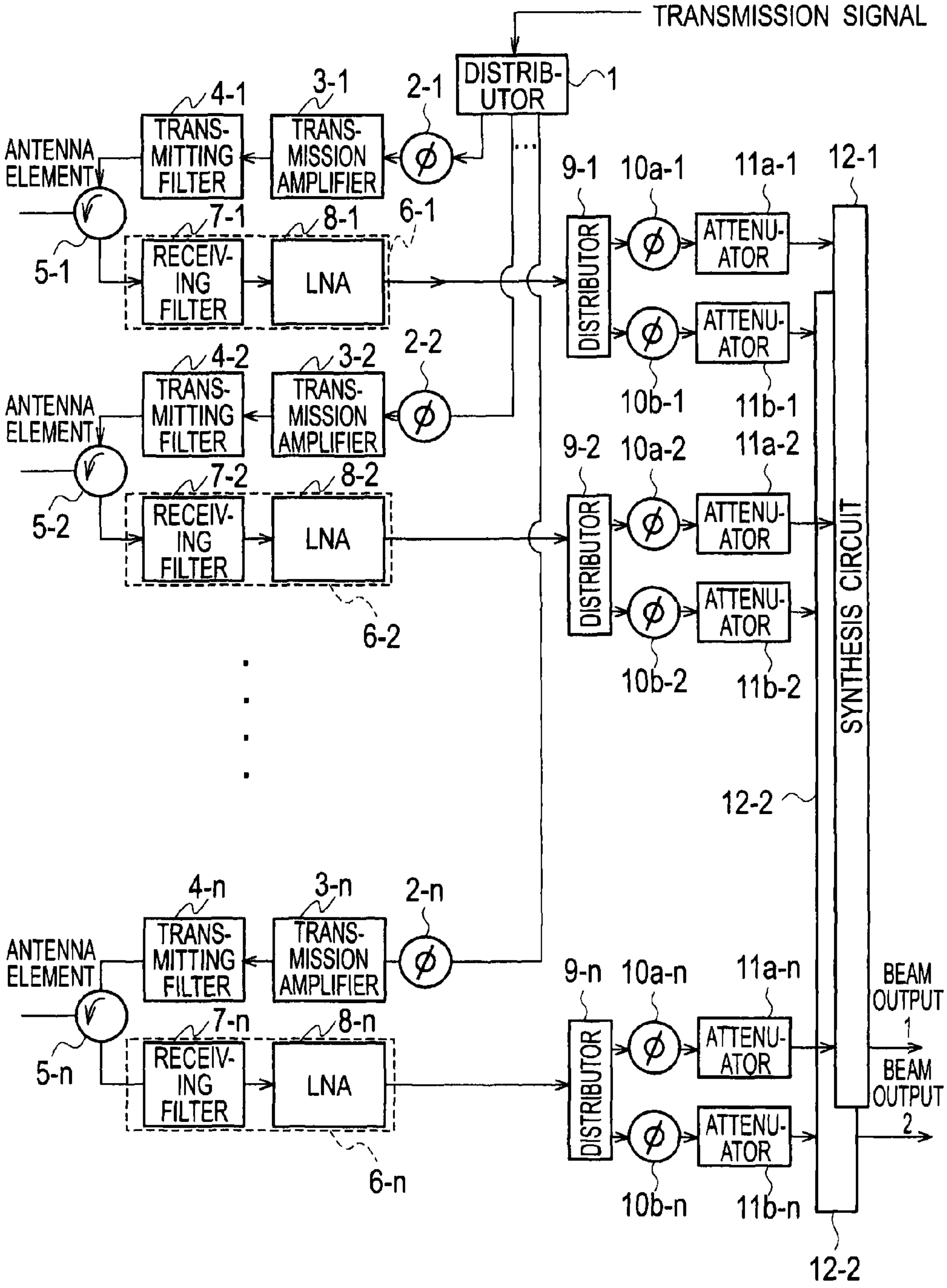
FIG. 1 is a configuration block diagram of an active array antenna device according to a first embodiment.

An object to be achieved by the present invention is to provide an active array antenna device in which a reception system can be made highly sensitive by making a feed loss occurring between an antenna and an LNA close to zero and by reducing an internal noise of the LNA.

According to one embodiment, the active array antenna device includes M receiving filters, M LNAs and M distributors, M sets of N phase shifters, M sets of N attenuators, N beam synthesis circuits, heat insulating containers, and a cooler.

The M ($M \geq 2$) receiving filters allow signals received by M antenna elements or antenna sub-arrays to pass through a predetermined band. The M LNAs amplify the M received signals from the M receiving filters. The M distributors each distribute a corresponding one of the M amplified signals amplified by the M LNAs into N ($N \geq 2$) distributed signals. The M sets of N phase shifters are provided for each of the M distributors and shift the phases of the N distributed signals distributed by each distributor. The M sets of N attenuators attenuate the respective N phase-shift signals from the N phase shifters. The N beam synthesis circuits are provided for all of the individual attenuators. Each beam synthesis circuit adds corresponding outputs from as many attenuators as M distributors to synthesize a beam. Each heat insulating container is a vaccum chamber or the like accommodating a corresponding one of the LNAs and the corresponding receiving filter made of a superconductor material. The cooler cools the receiving filter and the LNA to make the receiving filter in a superconducting state.

Hereinbelow, embodiments of the invention will be described in detail with reference to the drawings.

First Embodiment

An active array antenna device in First Embodiment uses an active phased array system with at least reception LNAs incorporated therein and a digital beam forming (DBF) system for forming multiple independent received beams (multi-beams), and achieves multi-functionality. Note that embodiments of the invention are not limited to the DBF system. The active array antenna device makes a reception system highly sensitive by making a feed loss occurring between an antenna and an LNA close to zero and by reducing an internal noise of the LNA.

Firstly, a description is given of a system noise temperature of a reception antenna. The system noise temperature is a value for determining a noise level of a reception system. An output resulting from multiplying a product of the system noise temperature and a bandwidth of the reception system by a certain constant (a Boltzmann constant) is a noise power in the reception system. This means that reducing the system noise temperature can directly improve an S/N ratio of a received signal and makes a reception system highly sensitive.

Generally, the system noise temperature is representatively expressed by a system noise temperature Ts in an output terminal of the antenna. The system noise temperature Ts is constituted of: a noise (Ta) entering from outside the antenna to an output (reception) terminal of the antenna; a noise (Tr) due to a loss in a feed system between the antenna and the LNA; an LNA internal noise (Te) added in the LNA; and a noise added in a reception system after the LNA.

An impact of the noise added in the reception system after the LNA can be ignored by making design consideration such as making an LNA gain high enough. Thus, the following shows a calculation expression of the system noise temperature.

$$Ts = Ta + Tr + Lr * Te$$

Under general conditions, the system noise temperature is expressed by the following expression.

$$Ta = (0.876 * Tsky + 36)/La + Tta * (1 - 1/La)$$

$$Tr = Ttr * (Lr - 1)$$

$$Te = To * (Fn - 1)$$

Tsky denotes a sky noise temperature; La, an ohmic loss of an antenna; Tta, a temperature of the antenna; Ttr, a temperature of a feed system; Lr, a loss of the feed system; To, a temperature of an equipment (an LNA unit); and Fn, an LNA noise figure. In general designing, Tta=Ttr=To=290K is used as a reference temperature of unit equipments.

Judging from the above calculation expression, the system noise temperature can be reduced by reducing the losses and the LNA noise figure (the sky noise entering from the outside is an environmental noise and thus can not be reduced). The system noise temperature can also be reduced by lowering the temperature of the units.

The following shows an exemplary calculation of the system noise temperature in a virtual reception system configuration. The exemplary calculation uses the sky noise temperature of approximately 50K (equivalent to a elevation angle of 2 degrees) which is a representative value in a microwave band between 1 GHz and 10 GHz frequently used for a radar.

Tsky=50 K; sky noise temperature
Tta=Ttr=To=290K; reference temperature
La=0.2 dB; antenna ohmic loss
Lr=5 dB; feed system loss
Fn=3 dB; LNA noise figure
Ta=89K, Tr=627K, and Te=289K leads to Ts=1629K.

If Lr=0 dB, Fn=1 dB can be established without changing the other conditions, Ta=89K, Tr=0K, Te=75K holds true, thus leading to Ts=164K. The system noise temperature becomes one tenth, and thereby the S/N ratio can be improved by 10 dB. While the feed loss between the antenna and the LNA is made close to zero, the internal noise added in the LNA is minimized by minimizing the LNA noise figure (Fn). That is, the reception system can be made highly sensitive.

As described above, the application of the active phased array with a number of antenna elements arranged therein can simultaneously achieve multi-beam formation and high sensitivity reception. In this embodiment, in order to effectively utilize the characteristics of the active antenna, a superconducting line is used for a feed system between the antenna and the LNA to make the loss close to zero, and the internal noise added in the LNA is reduced by cooling the LNA.

The cooling of the LNA can reduce the noise figure and lowers the unit temperatures, thus reducing the noise temperature. The combination of the use of the superconducting line and the cooling of the LNA can provide a large noise reduction effect. The following show noise reduction effects.

(1) Parabola Antenna (Before the Improvement)
Lr=5 dB; feed system loss
Fn=3 dB; LNA noise figure
Ta=89K, Tr=627K, Te=289K leads to Ts=1629K.

(2) Active Antenna
Lr=2 dB; feed system loss
Fn=3 dB; LNA noise figure
Ta=89K, Tr=170K, Te=289K leads to Ts=716K. (improved by 3.6 dB)

(3) Application of the Superconductivity Technique to the Feed System
Changes are made as follows: Lr=0.5 dB; Ttr=80K
Ta=89K, Tr=10K, Te=289K leads to Ts=423K. (improved by 5.9 dB)

(4) Application of the LNA Cooling to the Feed System as Well as (3) Above
Changes are made as follows: To=100K; Fn=1 dB Ta=89K, Tr=10K, Te=26K leads to Ts=128K. (improved by 11.0 dB)

As described above, by using the superconducting line and by cooling the LNA, the system noise temperature can be reduced largely.

Next, a description is given of a specific configuration in First Embodiment. FIG. 1 is a configuration block diagram of an active array antenna device according to First Embodiment. The active array antenna device includes a distributor 1, phase shifters 2-1 to 2-*n*, transmission amplifiers 3-1 to 3-*n*, transmitting filters 4-1 to 4-*n*, circulators 5-1 to 5-*n*, vaccum chambers 6-1 to 6-*n*, receiving filters 7-1 to 7-*n*, LNAs 8-1 to 8-*n*, distributors 9-1 to 9-*n*, phase shifters 10*a*-1 to 10*a*-*n*, 10*b*-1 to 10*b*-*n*, attenuators 11*a*-1 to 11*a*-*n*, 11*b*-1 to 11*b*-*n*, and synthesis circuits 12-1, 12-2. Antenna elements, the number of which is n, are provided for the respective transmitting filters 4-1 to 4-*n*.

The distributor 1 distributes a transmission signal to the phase shifters 2-1 to 2-*n*. The phase shifters 2-1 to 2-*n* shift the phases of the transmission signals from the distributor 1 by a predetermined phase amount per antenna element to output the transmission signals to the transmission amplifiers 3-1 to 3-*n*. The transmission amplifiers 3-1 to 3-*n* amplify the transmission signals from the phase shifters 2-1 to 2-*n* to output the transmission signals to the transmitting filters 4-1 to 4-*n*.

The transmitting filters 4-1 to 4-*n* perform filtering on the transmission signals from the transmission amplifiers 3-1 to 3-*n* to output the transmission signals to the respective antenna elements. The circulators 5-1 to 5-*n* output received signals from the respective antenna elements to output the received signals to the receiving filters 7-1 to 7-*n*.

The vaccum chambers 6-1 to 6-*n* include the receiving filters 7-1 to 7-*n* and the LNAs 8-1 to 8-*n*. The details of the vaccum chambers 6-1 to 6-*n*, the receiving filters 7-1 to 7-*n*, and the LNAs 8-1 to 8-*n* will be described later. The receiving filters 7-1 to 7-*n* allow the received signals from the circulators 5-1 to 5-*n* to pass a predetermined band to output the passing signals to the LNAs 8-1 to 8-*n*. The LNAs 8-1 to 8-*n* amplify the signals from the receiving filters 7-1 to 7-*n* to have low noises and then output the signals to the distributors 9-1 to 9-*n*.

The distributors 9-1 to 9-*n* distribute the signals from the receiving filters 7-1 to 7-*n* to the phase shifters 10*a*-1 to 10*a*-*n*, 10*b*-1 to 10*b*-*n*. The phase shifters 10*a*-1 to 10*a*-*n*, 10*b*-1 to 10*b*-*n* shift the phases of the signals from the distributors 9-1 to 9-*n* by phase amounts predetermined on the phase shifter basis, and then output the signals to the attenuators 11*a*-1 to 11*a*-*n*, 11*b*-1 to 11*b*-*n*.

The attenuators 11*a*-1 to 11*a*-*n*, 11*b*-1 to 11*b*-*n* attenuate the signals by attenuation amounts predetermined on the attenuator basis, and then output the signals to the synthesis circuits 12-1, 12-2 (corresponding to beam synthesis circuits). The synthesis circuit 12-1 performs beam synthesis on the multiple signals from the attenuators 11*a*-1 to 11*a*-*n* into a beam output 1. The synthesis circuit 12-2 performs beam synthesis on the multiple signals from the attenuators 11*b*-1 to 11*b*-*n* into a beam output 2.

Two beam outputs are shown in FIG. 1, but the number of beam outputs is not limited to this. A necessary number of beams may be outputted.

Figure 2:
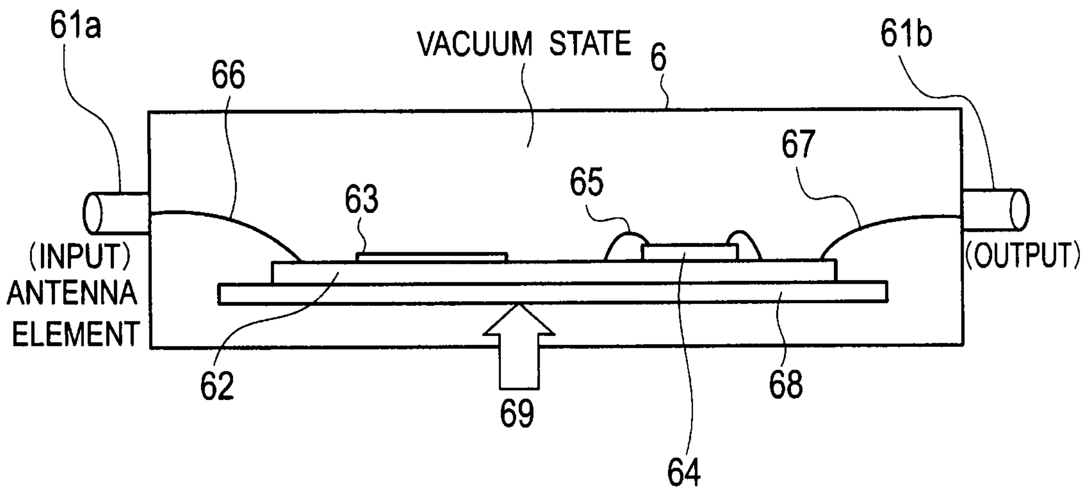
FIG. 2 is a cross sectional diagram of a vaccum chamber which is sealed and contains a receiving filter and an LNA of the active array antenna device according to the first embodiment.

FIG. 2 is a cross sectional diagram of a vaccum chamber which is sealed and contains a receiving filter and an LNA of the active array antenna device according to the first embodiment. The superconducting state can be achieved at an extremely low temperature, and the vaccum chamber 6 (corresponding to a heat insulating container) is used for heat insulation from the outside.

An hermetic seal connector 61*a* is attached to the input side of the vaccum chamber 6, being connected to an antenna element with the circulator 5 placed in between. Incidentally, the other terminal of the circulator 5 is connected to a transmission amplifier system including the transmission amplifier 3. An hermetic seal connector 61*b* is attached to the output side of the vaccum chamber 6. A coaxial cable 66 connects the hermetic seal connector 61*a* and a substrate for superconducting microstrip line 62, while a coaxial cable 67 connects the hermetic seal connector 61*b* and the substrate for superconducting microstrip line 62.

The vaccum chamber 6 has therein a cooling plate 68. The substrate for superconducting microstrip line 62 formed by a superconducting element is arranged on the cooling plate 68, and a superconducting circuit such as a receiving filter 63 to be cooled and formed by a substrate pattern is provided on the substrate for superconducting microstrip line 62. If the cooling plate 68 cools the antenna element, the circulator 5, a connection line, and the like in addition to the receiving filter 63, further high sensitivity can be achieved. However, all of these do not have to be cooled. The receiving filter 63 and input and output portions thereof may mainly be cooled. In addition, an LNA 64 is arranged on the substrate for superconducting microstrip line 62, being mounted thereon as a chip.

A matching circuit required for an LNA may be configured in the LNA 64 chip or on the substrate for superconducting microstrip line 62.

The LNA 64 is connected to the substrate for superconducting microstrip line 62 with a bonding wire 65. An output terminal of the LNA 64 is connected to the hermetic seal connector 61*b* on the output side of the vaccum chamber 6 through a line on the substrate for superconducting microstrip line 62 and the coaxial cable 67. Connections for power supply, control, and the like for the LNA 64 are also provided by wirings penetrating the vaccum chamber 6.

Cooling the cooling plate 68 by a cooler 69 from outside the vaccum chamber 6 makes the superconducting circuit in the superconducting state through the cooling plate 68 and simultaneously cools the LNA 64. Since the vaccum chamber 6 is used, there is a certain limitation on the size of a cooled target.

First Embodiment is applicable to a reception system in an active antenna with the LNA 64 incorporated therein, further a reception system of a transceiver module, and the like.

In First Embodiment, the transmission amplifier system including a transmission amplifier 3, the circulator 5, and the like, in addition to the reception system accommodated in the vaccum chamber 6 configure the transceiver module. In addition, the antenna elements and the transceiver modules are arranged in an array to configure the active array antenna device. Note that antenna sub-arrays may be used instead of the antenna elements. In addition, a switch or the like may be used instead of the circulator 5.

The synthesis circuit 12 may have the function of the attenuator 11 incorporated therein. The order of the phase shifter 10 and the attenuator 11 may be inversed.

Further, the DBF system may be applicable by which processing after the distributor 9 is digitally performed by using a received signal subjected to AD conversion of output from the LNA 64 or a received signal subjected to AD conversion using an IF signal subjected to frequency conversion.

If the transmission function is not required, transmission-related components may be eliminated, such as the distributor 1, the phase shifters 2, the transmission amplifiers 3, the transmitting filters 4, the circulators 5, and the like.

As described above, with the active array antenna device in First Embodiment, multi-beams are formed by using the active phased array system, the cooling of the cooling plate 68 makes the superconduction circuit having the receiving filter 63 in the superconducting state and simultaneously cools the LNA 64. These make a feed loss between the antenna and the LNA close to zero and reduce the LNA internal noise, so that the reception system can be made highly sensitive.

Second Embodiment

Figure 3:
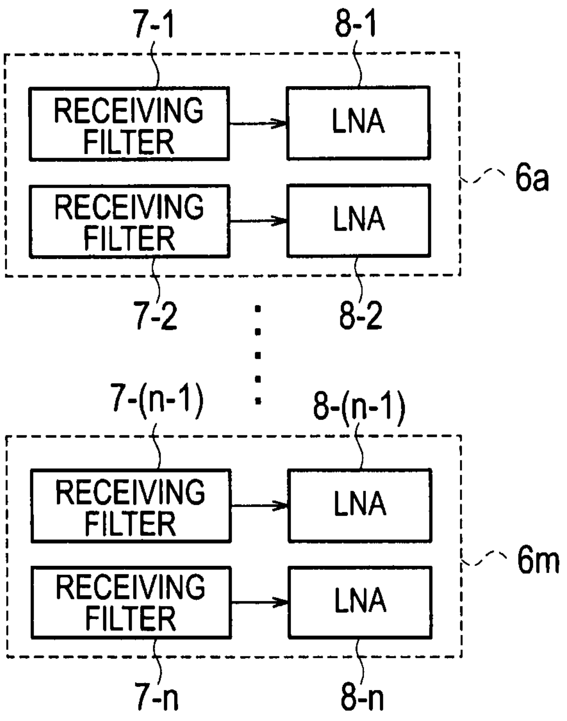
FIG. 3 is a configuration block diagram of an active array antenna device according to a second embodiment.

FIG. 3 is a configuration block diagram of an active array antenna device according to Second Embodiment. In Second Embodiment in FIG. 3, all of the multiple receiving filters 7-1 to 7-*n* and the LNAs 8-1 to 8-*n* in First Embodiment in FIG. 1 are divided for multiple vaccum chambers 6*a* to 6*m* (m<n).

In an example shown in FIG. 3, two receiving filters and two LNAs are provided in a single vaccum chamber. This configuration saves the number of vaccum chambers.

In this case, multiple hermetic seal connectors are arranged in line on one side of each of the vaccum chambers 6*a* to 6*m*, and each connector is connected to an antenna element through one terminal of a circulator. A transmitting filter is connected to the other terminal of the circulator.

A single shared cooling plate is provided in each of the vaccum chambers 6*a* to 6*m*, and a substrate for superconducting microstrip line is arranged on the shared cooling plate. The substrate for superconducting microstrip line has multiple receiving filters formed as a substrate pattern. An input terminal of each receiving filter is connected to the corresponding hermetic seal connector, while an output terminal of the receiving filter is connected to an LNA input terminal.

As many LNAs as the receiving filters are mounted as chips on the substrate for superconducting microstrip line, and output terminals thereof are respectively connected, through lines on the substrate for superconducting microstrip line, to output-side hermetic seal connectors arranged in line on an opposite surface of the vaccum chamber. To reduce the number of the output-side hermetic seal connectors, beam synthesis circuits required as well may be accommodated in the vaccum chamber. Connections for power supply, control, and the like for the LNAs are also provided by wirings penetrating the vaccum chamber.

An active array antenna may be formed by integrally configuring a transmission amplifier system, a circulator, and the like in addition to a reception system accommodated in the vaccum chamber and by arranging them in an array form together with the corresponding antenna element. The antenna array may be arranged in line (one-dimensionally) or may be arranged two-dimensionally further.

An array antenna using an antenna sub-array instead of the antenna element may be used. The reception system is simply shown by the receiving filters and the LNAs, but includes a part structurally required such as an hermetic seal connector configured to connect the vaccum chamber to the inside and the outside thereof.

Note that some of the multiple receiving filters 7-1 to 7-*n* and the LNAs 8-1 to 8-*n* may be divided for multiple vaccum chambers.

Third Embodiment

Figure 4:
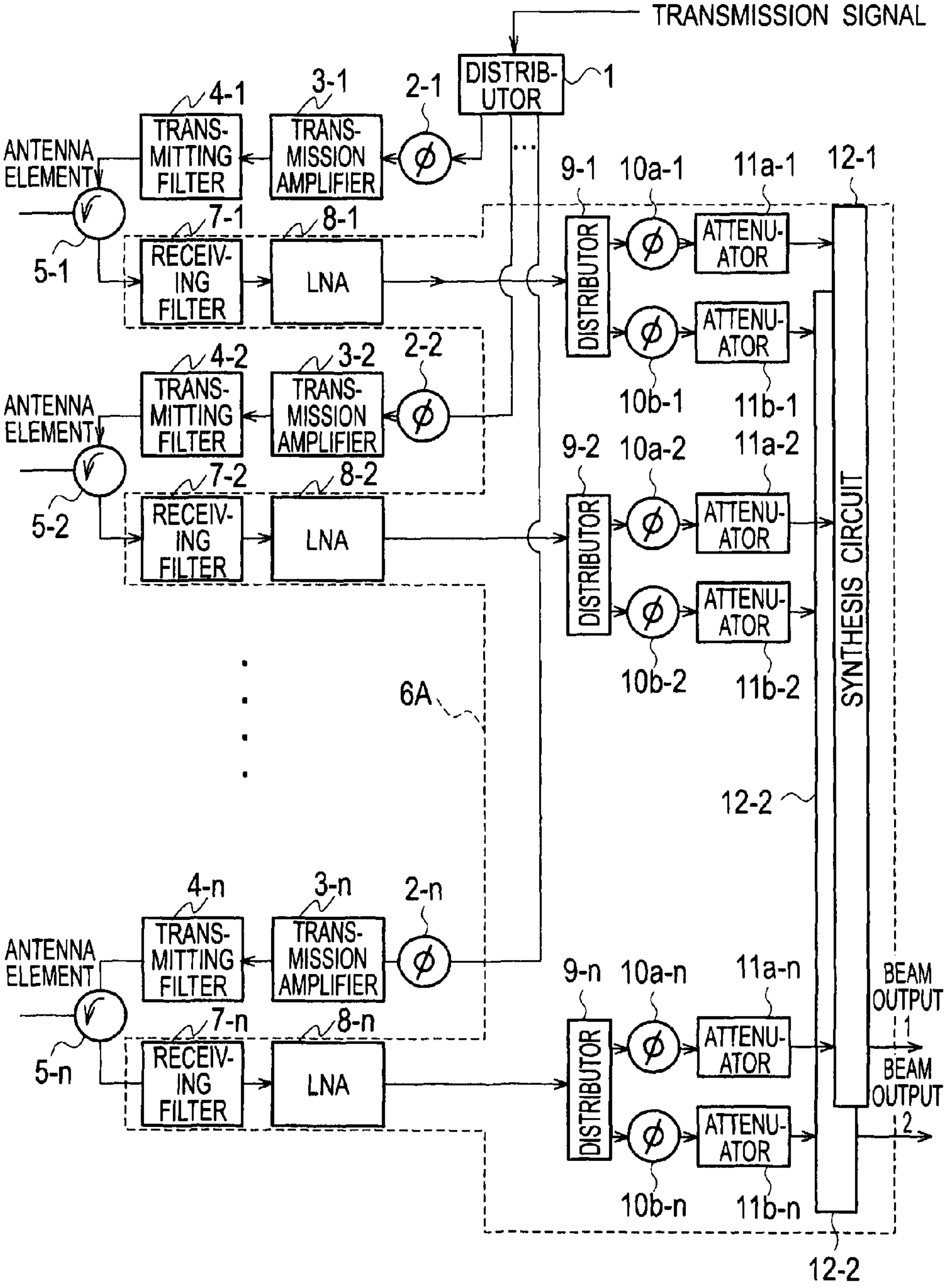
FIG. 4 is a configuration block diagram of an active array antenna device according to a third embodiment.

FIG. 4 is a configuration block diagram of an active array antenna device according to Third Embodiment. Third Embodiment in FIG. 4 is characterized in that a single vaccum chamber 6A includes the receiving filters 7-1 to 7-*n*, the LNAs 8-1 to 8-*n*, the distributors 9-1 to 9-*n*, the phase shifters 10*a*-1 to 10*a-n*, 10*b*-1 to 10*b-n*, the attenuators 11*a*-1 to 11*a-n*, 11*b*-1 to 11*b-n*, and the synthesis circuits 12-1, 12-2.

Such a configuration can achieve highly sensitive reception more easily, because a portion for synthesizing beams after amplifying and distributing received signals is provided in the single vaccum chamber 6A.

Fourth Embodiment

Figure 5:
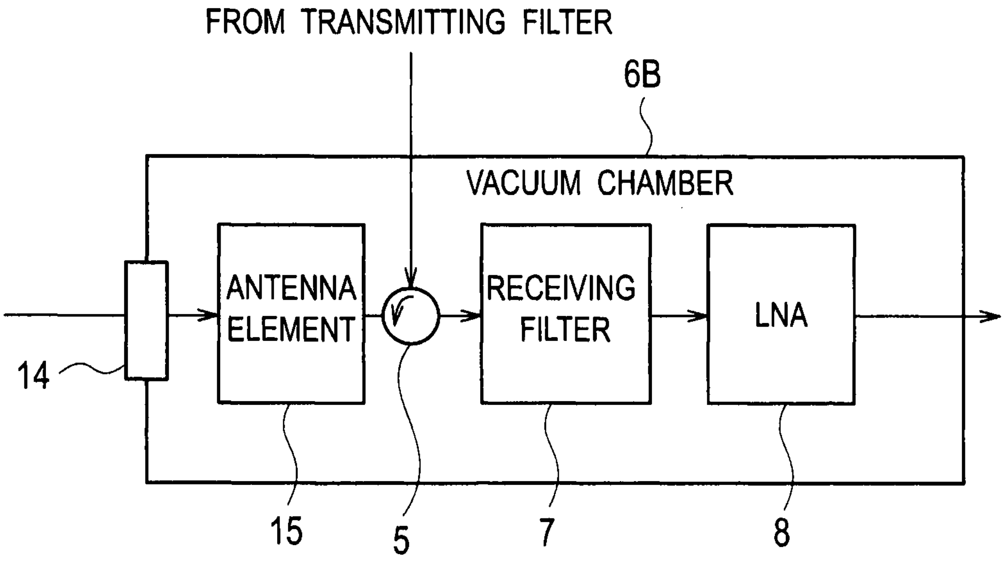
FIG. 5 is a configuration block diagram of an active array antenna device according to a fourth embodiment.

FIG. 5 is a configuration block diagram of an active array antenna device according to Fourth Embodiment. Fourth Embodiment in FIG. 5 is characterized in that in addition to the configuration in First Embodiment in FIG. 1, a vaccum chamber 6B has therein not only an antenna element 15 or an (unillustrated) antenna sub-array but also, at least a part of the vaccum chamber 6B, a member, such as a radome member 14, having a property of transmitting a reception radio wave through into the vaccum chamber 6B. A signal received by the antenna element 15 through the radome member 14 is inputted to the receiving filter 7 through the circulator 5.

Such a configuration can not only achieve more highly sensitive reception but also eliminate the hermetic seal connector, because the antenna element 15 and the circulator 5 are provided in the vaccum chamber 6B.

The circulator 5 may be provided outside the vaccum chamber 6B together with the transmission-side circuit. When the antenna element 15 is used for reception only (for example, when transmission and reception antennas are provided separately), the circulator 5 may be eliminated.

Fifth Embodiment

Figure 6:
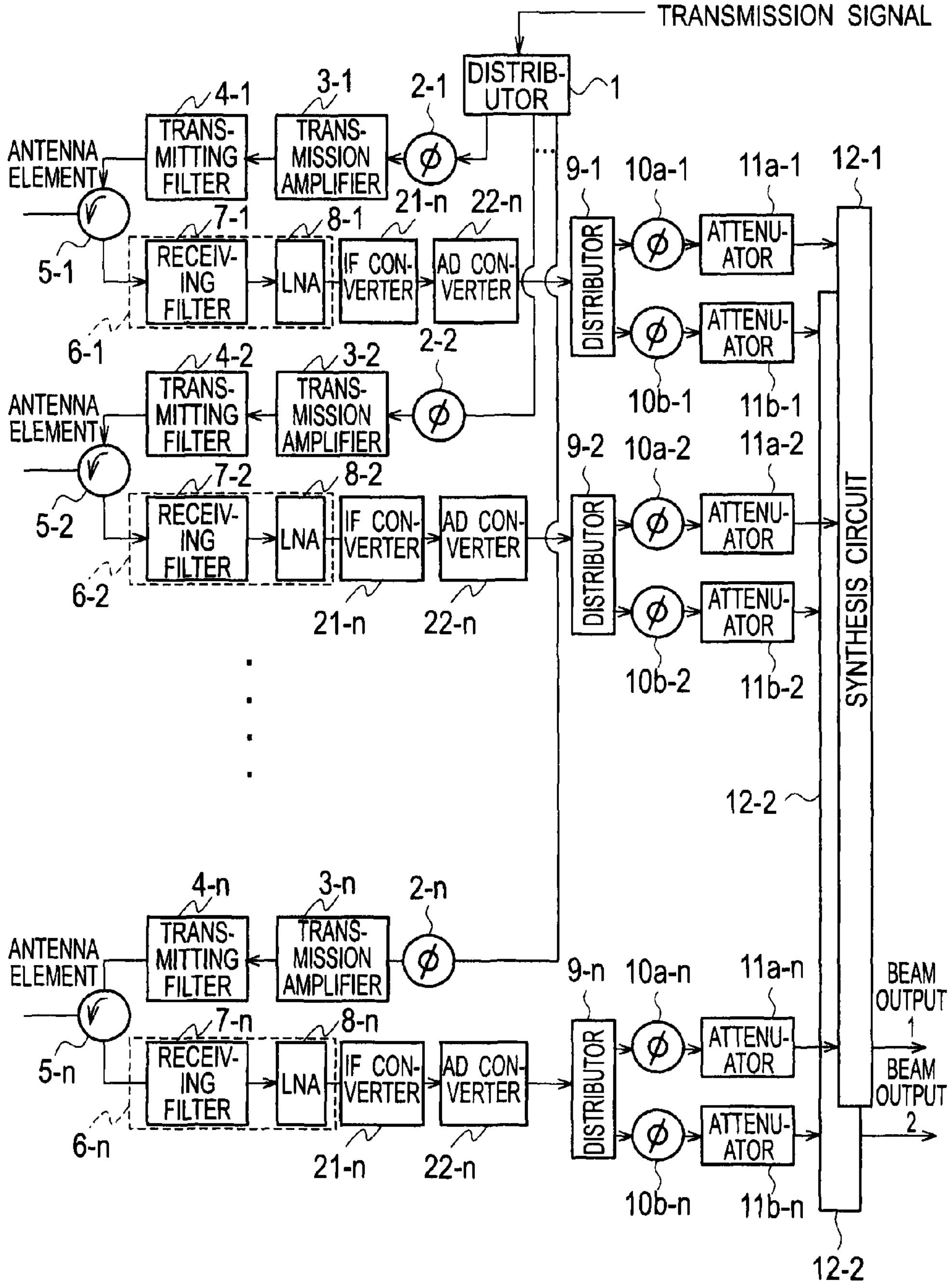
FIG. 6 is a configuration block diagram of an active array antenna device according to a fifth embodiment.

FIG. 6 is a configuration block diagram of an active array antenna device according to Fifth Embodiment. Fifth Embodiment in FIG. 6 is characterized in that IF converters 21-1 to 21-*n*, and AD converters 22-1 to 22-*n* are provided on the output side of the LNAs 8-1 to 8-*n* in addition to First Embodiment in FIG. 1.

The IF converters 21-1 to 21-*n* perform frequency conversion on signals from the LNAs 8-1 to 8-*n* to obtain IF signals. The AD converters 22-1 to 22-*n* perform AD conversion on the IF signals. In other words, the beams can be synthesized by the DBF processing.

Alternatively, beam synthesis processing for received signals after the distributors 9-1 to 9-*n* may use a DBF processing system in which digital processing is performed by IF converters and AD converters.

Sixth Embodiment

Figure 7:
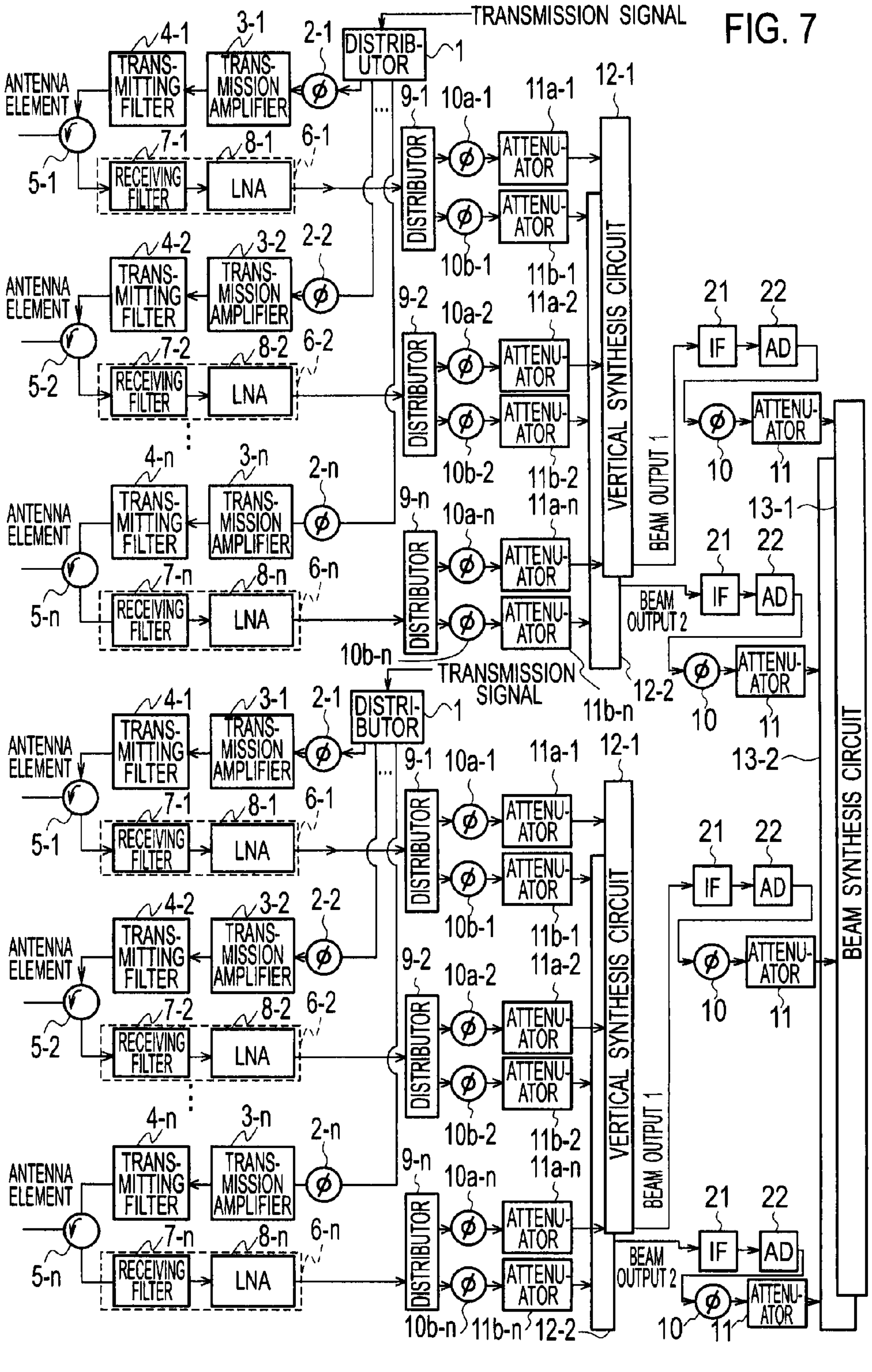
FIG. 7 is a configuration block diagram of an active array antenna device according to a sixth embodiment.

FIG. 7 is a configuration block diagram of an active array antenna device according to Sixth Embodiment. Sixth Embodiment in FIG. 7 is characterized in that, in comparison with First Embodiment in FIG. 1, the active array antenna device includes: vertical synthesis circuits 12-1, 12-2 configured to synthesize multiple (one-dimensional) vertical beams from RF signals; IF converters 21 configured to perform IF conversion on the synthesized (one-dimensional) vertical beams; AD converters 22 configured to convert the IF signals from the IF converters 21 into digital signals; and horizontal synthesis circuits 13-1, 13-2 configured to synthesize multiple horizontal beams from the digital signals.

Specifically, when the size of the beam synthesis circuits is increased for the DBF processing, the beam synthesis circuits 13-1, 13-2 are formed in a casing separated from antenna apertures in which reception systems including the antenna elements and the vaccum chambers (or transceiver modules) are arranged.

In this case, multiple vertical beams are synthesized from the RF signals, the synthesized beams are subjected to the IF conversion, and the DBF processing is performed to synthesize the multiple horizontal beams from the digital signals obtained by the AD conversion. Thus, the beam synthesizing can be performed by being divided into the multiple steps.

When the beam synthesizing is performed at the multiple steps, some of the beam synthesis circuits can be accommodated in a single vaccum chamber as long as the vaccum chamber has an appropriate size for the accommodation.

In FIG. 7, the RF signals are each distributed by the distributor 9 into the multiple signals to obtain different beam outputs from the vertical synthesis circuits 12-1, 12-2. However, outputs from the AD converters 22 may be each distributed into multiple signals to obtain different beam outputs from the respective horizontal synthesis circuits. Further, both the configurations may be used in combination with each other.

Seventh Embodiment

Figure 8:
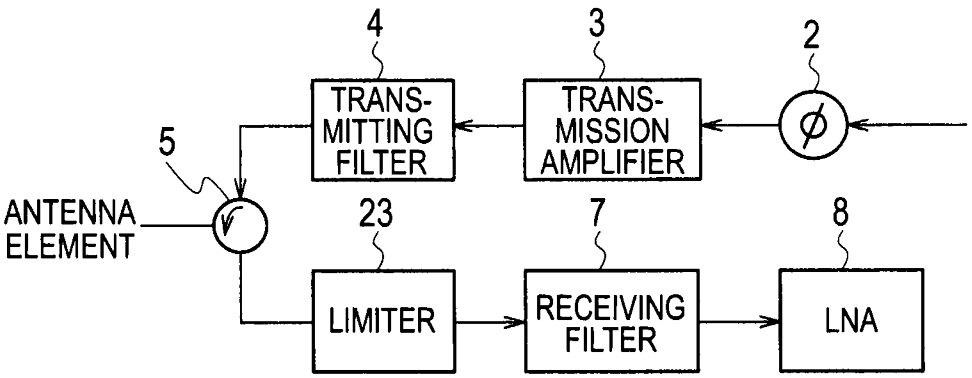
FIG. 8 is a configuration block diagram of an active array antenna device according to a seventh embodiment.

FIG. 8 is a configuration block diagram of an active array antenna device according to Seventh Embodiment. Seventh Embodiment in FIG. 8 is characterized in that a limiter 23 is provided between the circulator 5 and the receiving filter 7 to have the same center frequency in transmission and reception.

Such a configuration can protect the reception system such as the receiving filter 7 and the LNA B, because use of the limiter 23 limits a received signal to a certain level.

Eighth Embodiment

Figure 9:
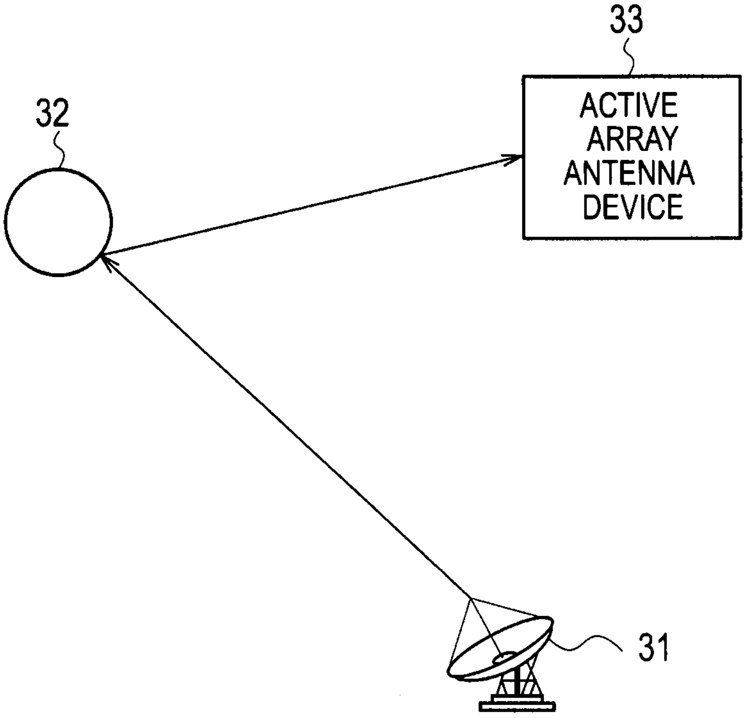
FIG. 9 is a configuration block diagram of an active array antenna device according to an eighth embodiment.

FIG. 9 is a configuration block diagram of an active array antenna device according to Eighth Embodiment. Eighth Embodiment in FIG. 9 is characterized in that antenna elements of an active array antenna device 33 are used as a reception antenna, radio waves transmitted from a transmission antenna 31 are reflected from a target, and the reflected radio waves are received by the antenna elements of the active array antenna device 33. Thereby, the target can be detected by using the received signals received by the antenna elements of the active array antenna device 33.

Ninth Embodiment

Figure 10:
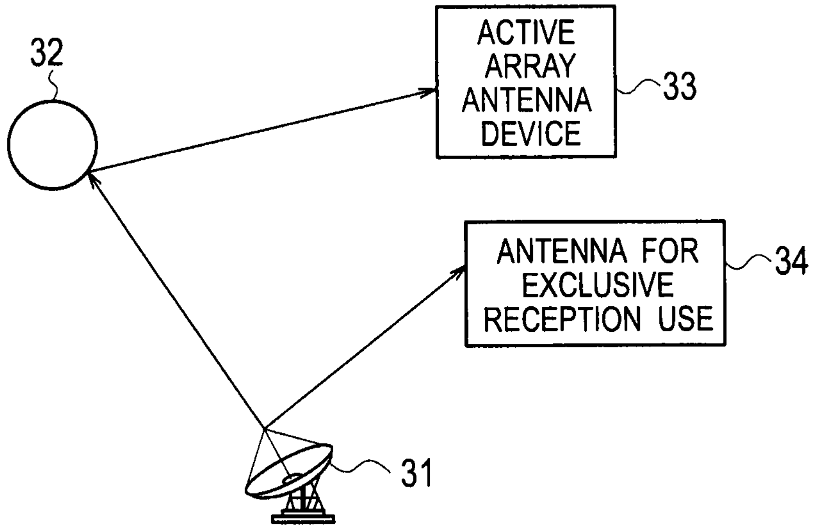
FIG. 10 is a configuration block diagram of an active array antenna device according to a ninth embodiment.

FIG. 10 is a configuration block diagram of an active array antenna device according to Ninth Embodiment. In Ninth Embodiment in FIG. 10, the antenna elements of the active array antenna device 33 are used as a reception antenna, and an antenna 34 for exclusive reception use configured to directly receive transmission signals (a different reception antenna from the reception antenna configured to receive radio waves reflected from the target) directly receives radio waves emitted from the transmission antenna 31. Thereby, a time point of emitting the radio waves can be analyzed.

When being used as the reception antenna, the active array antenna device 33 may also be used, rather than as a radar, as a microwave radiometer configured to measure microwave radiation of the target or an antenna of a high sensitivity reception system configured to directly receive transmission radio waves. In addition to this, the active array antenna device 33 is applicable for various usage requiring high sensitivity.

In the active array antenna device in these embodiments as described above, each receiving filter is provided between the corresponding antenna element and the LNA, the active antenna is formed by arranging the multiple antenna elements and the LNAs, the signals amplified by the LNAs are each distributed by the distributor, the independent received multi-beams are formed, each receiving filter and the corresponding LNA are accommodated in the same vaccum chamber, and the receiving filter and the LNA are cooled in the superconducting state. Thus, the feed loss between the antenna and the LNA is made close to zero while the LNA internal noise is reduced, so that the reception system can be made highly sensitive.

Note that the present invention is not limited to the active array antenna device according to First to Ninth Embodiments. For example, the transmission-reception switching function such as the circulator may be accommodated in the same vaccum chamber. In this case, the receiving filter may be used for both the transmission and reception by being provided between the antenna element and the transmission-reception switching function.

High sensitivity can be achieved further by cooling the circulator.

Since the antenna element is configured by the superconducting circuit, the ohmic loss of the antenna element can be avoided, and the noise temperature can be reduced further.

For example, a part of the apertures of a radar antenna may be used for both the transmission and reception, and the other part can be used for reception. The apertures can be divided for respective transmission and reception uses, such as providing an aperture for the transmission use only while configuring the other apertures for the reception. Further, parts for both the transmission and reception can be combined.

Antenna elements for transmission only and antenna elements for reception only may be arranged in combination with each other.

The present invention is not limited to the radar use, but can be used, for another purpose, as an antenna for transmitting and receiving radio waves, for example, as a communication antenna. When the frequency differs between transmission and reception, a diplexer or the like may be used as the transmission-reception switching function.

While certain embodiments have been described, these embodiments have been presented by way example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirits of the inventions. The accompanying claims and their equivalents are intended to cover such forms or modifications as would fall within the scope and spirit of the inventions.

The invention claimed is:

1. An active array antenna device comprising:

M (M≥2) receiving filters configured to allow part of received signals received by M antenna elements or antenna sub-arrays to pass therethrough, the part being signals within a certain band;

M low noise amplifiers configured to amplify M received signals from the M receiving filters;

M distributors each configured to distribute a corresponding one of the M amplified signals amplified by the M low noise amplifiers into N (N≥2) distributed signals;

M sets of N phase shifters, each set provided for the corresponding one of the distributors and configured to shift phases of the N distributed signals distributed by the distributor;

M sets of N attenuators, each set configured to attenuate N phase-shift signals from the N phase shifters;

N beam synthesis circuits provided respectively for M sets of the N attenuators, and each configured to synthesize a beam by adding up attenuator outputs that correspond to the M distributors and are outputted by the corresponding set of the M attenuators;

a heat insulating container configured to accommodate the receiving filters formed of a superconductor material and the low noise amplifiers;

a cooler configured to cool the receiving filters and the low noise amplifiers accommodated in the heat insulating container to make the receiving filters in a superconducting state; and a cooling plate accommodated in the heat insulating container and cooled by the cooler, and on which is placed the receiving filters and the low noise amplifiers.

2. The active array antenna device according to claim 1, wherein each of all or some pairs of the M receiving filters and the M low noise amplifiers, are accommodated in one of a plurality of the heat insulating containers respectively corresponding to all or some of the M antenna elements or the antenna sub-arrays.

3. The active array antenna device according to claim 1, wherein the heat insulating container further accommodates the N beam synthesis circuits.

4. The active array antenna device according to claim 1, wherein the heat insulating container further accommodates the M antenna elements or the antenna sub-arrays and has a transmission member which allows received radio waves to pass through into the insulating container to be inputted to the M antenna arrays or the sub-arrays.

5. The active array antenna device according to claim 1, comprising:

M A/D converters provided for the respective M low noise amplifiers and configured to perform AD conversion on RF signals or IF signals to output digital signals to the M distributors, the RF signals being the M received signals amplified by the low noise amplifiers, the IF signals being signals converted from the RF signals through frequency conversion, wherein the active array antenna device uses a digital beam forming system for synthesizing N beams from the digital signals obtained by the A/D converters through the A/D conversion.

6. The active array antenna device according to claim 1, comprising:

a first beam synthesis circuit configured to synthesize a beam from RF signals which are received signals, for some of the M antenna elements or antenna sub-arrays;

a frequency converter configured to perform frequency conversion on an RF signal which is the synthesis output from the first beam synthesis circuit;

an A/D converter configured to perform A/D conversion on a signal obtained by the frequency conversion; and a second beam synthesis circuit configured to further synthesize a plurality of beams from the signals obtained by the A/D conversion, wherein the second beam synthesis circuit is arranged separately from the heat insulating container.

7. The active array antenna device according to claim 1, wherein the heat insulating container is a vacuum insulating container at least part of which is in a vacuum state.

8. The active array antenna device according to claim 1, comprising:

a transmission-reception switching unit configured to perform switching between transmission and reception of the signals to and from each of the antenna elements; and a limiter provided between the transmission-reception switching unit and the low noise amplifier and configured to limit a signal level of a received signal from the transmission-reception switching unit.

9. The active array antenna device according to claim 1, wherein the M antenna elements or the antenna sub-arrays receive radio waves transmitted from a transmission antenna and reflected from a target, and the received signals are used by a radar device to detect the object.

10. The active array antenna device according to claim 1, wherein the M antenna elements or the antenna sub-arrays receive radio waves radiated from a target, and the received signals are used for measuring radiation intensities of the radio waves from the target.

11. The active array antenna device according to claim 1, wherein the M antenna elements or the antenna sub-arrays receive radio waves transmitted from a transmission antenna different from the active array antenna device, and at least a time point of transmitting the radio waves is analyzed.

12. An active array antenna device comprising:

M ($M \geq 2$) receiving filters configured to allow part of received signals received by M antenna elements or antenna sub-arrays to pass there through, the part being signals within a certain band;

M low noise amplifiers configured to amplify M received signals from the M receiving filters;

M distributors each configured to distribute a corresponding one of the M amplified signals amplified by the M low noise amplifiers into N ($N \geq 2$) distributed signals;

M sets of N phase shifters, each set provided for the corresponding one of the distributors and configured to shift phases of the N distributed signals distributed by the distributor;

M sets of N attenuators, each set configured to attenuate N phase-shift signals from the N phase shifters;

N beam synthesis circuits provided respectively for M sets of the N attenuators, and each configured to synthesize a beam by adding up attenuator outputs that correspond to the M distributors and are outputted by the corresponding set of the M attenuators;

a heat insulating container configured to accommodate the receiving filters formed of a superconductor material and the low noise amplifiers;

a cooler configured to cool the receiving filters and the low noise amplifiers accommodated in the heat insulating container to make the receiving filters in a superconducting state; and a cooling plate accommodated in the heat insulating container and cooled by the cooler, and on which is placed the receiving filters and the low noise amplifiers, wherein the M receiving filters and the M low noise amplifiers, are divided into groups including one or more pairs and are accommodated group by group in a plurality of the heat insulating containers.

13. An active array antenna device comprising:

M ($M \geq 2$) receiving filters configured to allow part of received signals received by M antenna elements or antenna sub-arrays to pass there through, the part being signals within a certain band;

M low noise amplifiers configured to amplify M received signals from the M receiving filters;

M distributors each configured to distribute a corresponding one of the M amplified signals amplified by the M low noise amplifiers into N ($N \geq 2$) distributed signals;

M sets of N phase shifters, each set provided for the corresponding one of the distributors and configured to shift phases of the N distributed signals distributed by the distributor;

M sets of N attenuators, each set configured to attenuate N phase-shift signals from the N phase shifters;

N beam synthesis circuits provided respectively for M sets of the N attenuators, and each configured to synthesize a beam by adding up attenuator outputs that correspond to the M distributors and are outputted by the corresponding set of the M attenuators;

a heat insulating container configured to accommodate the receiving filters formed of a superconductor material and the low noise amplifiers;

a cooler configured to cool the receiving filters and the low noise amplifiers accommodated in the heat insulating container to make the receiving filters in a superconducting state; and a cooling plate accommodated in the heat insulating container, and on which is placed the receiving filters and the low noise amplifiers, and is cooled by the cooler, wherein some pairs of the M receiving filters and the M low noise amplifiers are divided into groups including one or more pairs and are accommodated group by group in a plurality of the heat insulating containers.

* * * * *